United States Patent
Lee

(10) Patent No.: US 7,149,130 B2
(45) Date of Patent: Dec. 12, 2006

(54) PAGE BUFFER CIRCUIT OF FLASH MEMORY DEVICE WITH REDUCED CONSUMPTION POWER

(75) Inventor: Yun Bong Lee, Chungcheongbuk-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 11/164,678

(22) Filed: Dec. 1, 2005

(65) Prior Publication Data
US 2006/0203549 A1 Sep. 14, 2006

(30) Foreign Application Priority Data
Mar. 10, 2005 (KR) .................. 10-2005-0020198

(51) Int. Cl.
*G11C 7/10* (2006.01)
*G11C 16/04* (2006.01)

(52) U.S. Cl. .................. 365/189.05; 365/185.33; 365/189.01

(58) Field of Classification Search ............ 365/189.05
See application file for complete search history.

(56) References Cited

U.S. PATENT DOCUMENTS

| | | | | |
|---|---|---|---|---|
| 5,936,890 A * | 8/1999 | Yeom | ............. | 365/185.22 |
| 5,982,663 A * | 11/1999 | Park | ............. | 365/185.09 |
| 6,031,760 A * | 2/2000 | Sakui et al. | ............. | 365/185.21 |
| 6,671,204 B1 * | 12/2003 | Im | ............. | 365/185.12 |
| 6,717,857 B1 * | 4/2004 | Byeon et al. | ............. | 365/185.21 |
| 6,826,082 B1 * | 11/2004 | Hwang et al. | ............. | 365/185.17 |
| 6,963,509 B1 * | 11/2005 | Ju | ............. | 365/189.05 |
| 6,996,014 B1 * | 2/2006 | Lee et al. | ............. | 365/189.05 |
| 7,016,229 B1 * | 3/2006 | Kim | ............. | 365/185.17 |
| 2005/0254301 A1 * | 11/2005 | Kim | ............. | 365/185.12 |
| 2006/0007774 A1 * | 1/2006 | Zanardi et al. | ............. | 365/235 |
| 2006/0039197 A1 * | 2/2006 | Khouri et al. | ............. | 365/185.12 |

* cited by examiner

*Primary Examiner*—Son L. Mai
(74) *Attorney, Agent, or Firm*—Marshall, Gerstein & Borun LLP

(57) ABSTRACT

A page buffer circuit of a flash memory device has small consumption power. The page buffer circuit utilizes different voltages are supplied to the latch circuits in the standby and normal modes to reduce consumption power in the standby mode.

8 Claims, 4 Drawing Sheets

PAGE BUFFER CIRCUIT OF FLASH MEMORY DEVICE WITH REDUCED CONSUMPTION POWER

TECHNICAL FIELD

This patent relates to flash memory devices and more particularly, to a page buffer circuit of a flash memory device.

DISCUSSION OF RELATED ART

Flash memory devices are usually configured to conduct operations of reading, programming, and erasing data therein. And, the flash memory devices employ page buffers to program or read a large amount of data in a short time. Therefore, the programming or reading operation of the flash memory device is carried out in the unit of page by means of the page buffers.

FIG. 1 is a diagram of a page buffer circuit used in a conventional flash memory device. The page buffer circuit 10 is constructed of a bitline selection circuit 11, a precharging circuit P11, a main register circuit 12, a cache register circuit 13, and pass circuit N17~N21. The main register circuit 12 includes a main latch circuit 14 and NMOS transistors N11~N13. The cache register circuit 13 includes NMOS transistors N14~N16. As referred to in FIG. 1, voltages VCC and VSS are input each to the main latch circuit 14 and the cache latch circuit 15 as operation voltages.

FIG. 2 is a diagram showing the main latch circuit (or cache latch circuit) of FIG. 1 in detail. Referring to FIG. 2, the main latch circuit 14 (or the cache latch circuit 15) includes PMOS transistors P31 and P32, and NMOS transistors N31 and N32. Sources of the PMOS transistors P31 and P32 are coupled to the voltage VCC, a node D1 is coupled to a drain of the PMOS transistor P31 and a gate of the PMOS transistor P32. Further, a node D2 is connected to a gate of the PMOS transistor P31 and a drain of the PMOS transistor P32. Sources of the NMOS transistors N31 and N32 are connected to the voltage VSS, and the node D1 is coupled to a drain of the NMOS transistor N31 and a gate of the NMOS transistor N32. The node D2 is connected to a gate of the NMOS transistor N31 and a drain of the NMOS transistor N32. The node D1 receives or outputs a signal QBb or QAb, and the node D2 receives a signal QB or QA. But, when the flash memory device including the page buffer 10 is being both in standby and normal modes, the nodes D1 and D2 receive the voltage VCC and VSS as operation voltages for the main latch circuit 14 and the cache latch circuit 15.

Meanwhile, signals at the nodes D1 and D2 in the main latch circuit 14 and the cache latch circuit 15, QBb or QAb, and QB or QA, are set on predetermined voltage levels. In detail, for example, when the signal of the node D2, QB or QA, is fixed to voltage VSS, the signal of the node D1, QBb or QAb, is fixed to the voltage level VCC. As a result, the PMOS transistor P31 and the NMOS transistor N32 are turned on while the PMOS transistor P32 and the NMOS transistor N31 are turned off. Here, through the PMOS and NMOS transistors, P32 and N31, which are being turned-off, a leakage current $I_L$ would be generated. Finally, although it needs to minimize the leakage current in the standby mode, the leakage current by the main latch circuit 14 and the cache latch circuit 15 causes increasing consumption power in the page buffer 10.

SUMMARY OF THE INVENTION

A page buffer circuit of a flash memory device with small consumption power in a standby mode, supplying different power source voltages each to latch circuits in standby and normal modes.

A page buffer of a flash memory device may include a bitline selection circuit connecting one of at least two bitlines to a sensing node in response to bitline selection signals; a cache register circuit storing a program data signal during a programming operation; a main register circuit storing a first state data signal corresponding to a read data signal received from one of the two bitlines through the sensing node in a reading operation, in response to a main latch signal, or storing a second state data signal corresponding to the program data signal received from the cache register circuit through the sensing node in a programming operation; and a power supply circuit providing first and second voltages to the main register circuit and the cache register circuit as operation voltages in an active mode, and providing a third voltage to the main register circuit and the cache register circuit as operation voltages in a standby mode.

The page buffer further may include a precharge circuit charging the sensing node up to a predetermined voltage level in response to a precharge control signal; a first switch transferring the program data signal from the cache register circuit to the main register circuit through the sensing node in the programming operation, in response to a first control signal, and disconnecting the cache register circuit from the sensing node in the reading operation; a second switch transferring an inverse data signal of the second state data signal from the main register circuit to one of the two bitlines connected to the sensing node through the bitline selection circuit in a second control signal during the programming operation; and a third switch transferring an inverse data signal of the first state data signal from the main register circuit to a Y-gate circuit in response to a third control signal during the reading operation.

The third voltage may be lower than the first voltage and higher than the second voltage.

The main register circuit may include a sensing circuit generating the first state data signal in response to the main latch signal and the read data signal, or generating the second state data signal in response to the main latch signal and the program data signal; a main latch circuit, connected to the sensing circuit through a first node, holding the first or second state data signal received through the first node and transferring an inverse data signal of the first state data signal or an inverse data signal of the second state data signal to a second node; and a main latch rest circuit initializing the main latch circuit in response to a main latch reset signal. The first and second nodes have different voltage levels from each other in the active mode, while the first and second nodes have the same voltage level in the standby mode.

The cache register circuit may include a cache latch circuit, connected between a third node and a fourth node, holding the program data signal received through the third node and transferring an inverse data signal of the program data signal to the fourth node, or holding the program data signal and transferring the inversed data signal of the program data signal to the third node; and a cache latch rest circuit, connected to the cache latch circuit through the third node, initializing the cache latch circuit in response to a cache latch reset signal. The third and fourth nodes have different voltage levels from each other in the active mode, while the third and fourth nodes have the same voltage level in the standby mode.

The main latch circuit may include a first inverter having an output terminal connected to the first node and an input terminal connected to the second node, receiving the operation voltages through fifth and sixth nodes; and a second inverter having an input terminal connected to the first node and an output terminal connected to the second node, receiving the operation voltages through the fifth and sixth nodes. The cache latch circuit comprise: a third inverter having an output terminal connected to the third node and an input terminal connected to the fourth node, receiving the operation voltages through seventh and eighth nodes; and a fourth inverter having an input terminal connected to the third node and an output terminal connected to the fourth node, receiving the operation voltages through the seventh and eighth nodes.

The power supply circuit may include a first switch connected among the fifth node, the seventh node, and the first voltage, and being turned on or off in response to a first selection control signal; a second switch connected among the sixth node, the eighth node, and the second voltage, and being turned on or off in response to the first selection control signal; a third switch connected among the fifth node, the seventh node, and the third voltage, and being turned on or off in response to a second selection control signal; and a fourth switch connected among the sixth node, the eighth node, and the third voltage, and being turned on or off in response to the second selection control signal.

In the active mode, the first selection control signal may be enabled while the second selection may be disabled. In the standby mode, the first selection control signal may be disabled while the second selection may be enabled. The first and second switches may be turned on when the first selection control signal is enabled, while the third and fourth switches are turned on when the second selection control signal is enabled.

BRIEF DESCRIPTION OF THE DRAWINGS

The accompanying drawings are included and are incorporated in and constitute a part of this specification. The drawings illustrate example embodiments. In the drawings.

DETAILED DESCRIPTION

Various embodiments will be described below in more detail with reference to the accompanying drawings. The present invention may, however, be embodied in different forms and should not be constructed as limited to the embodiments set forth herein. Rather, these embodiments are provided so that this disclosure will be thorough and complete. Like numerals refer to like elements throughout the specification.

Figure 1:
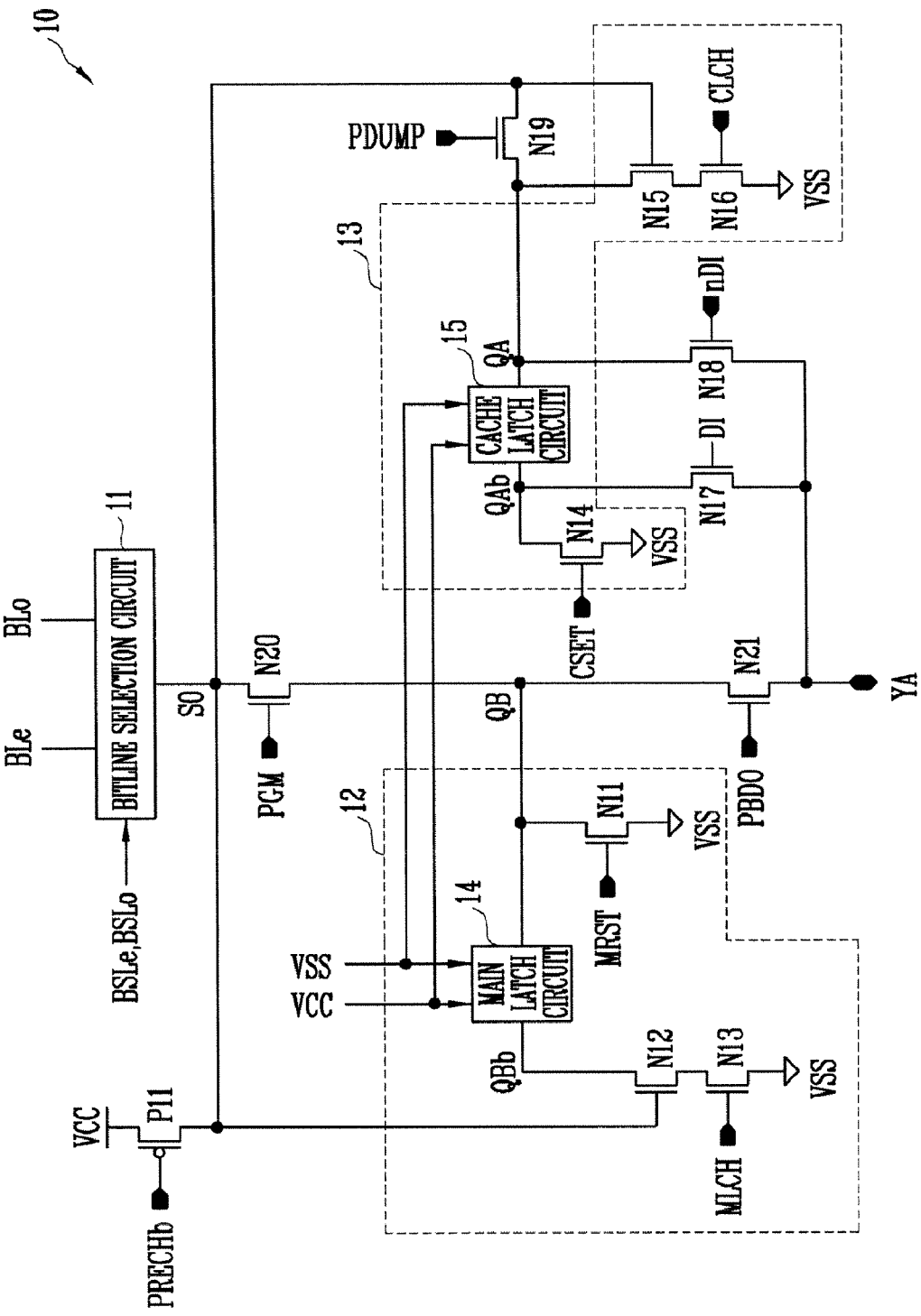
FIG. 1 is a diagram of a page buffer circuit used in a conventional flash memory device.
Figure 2:
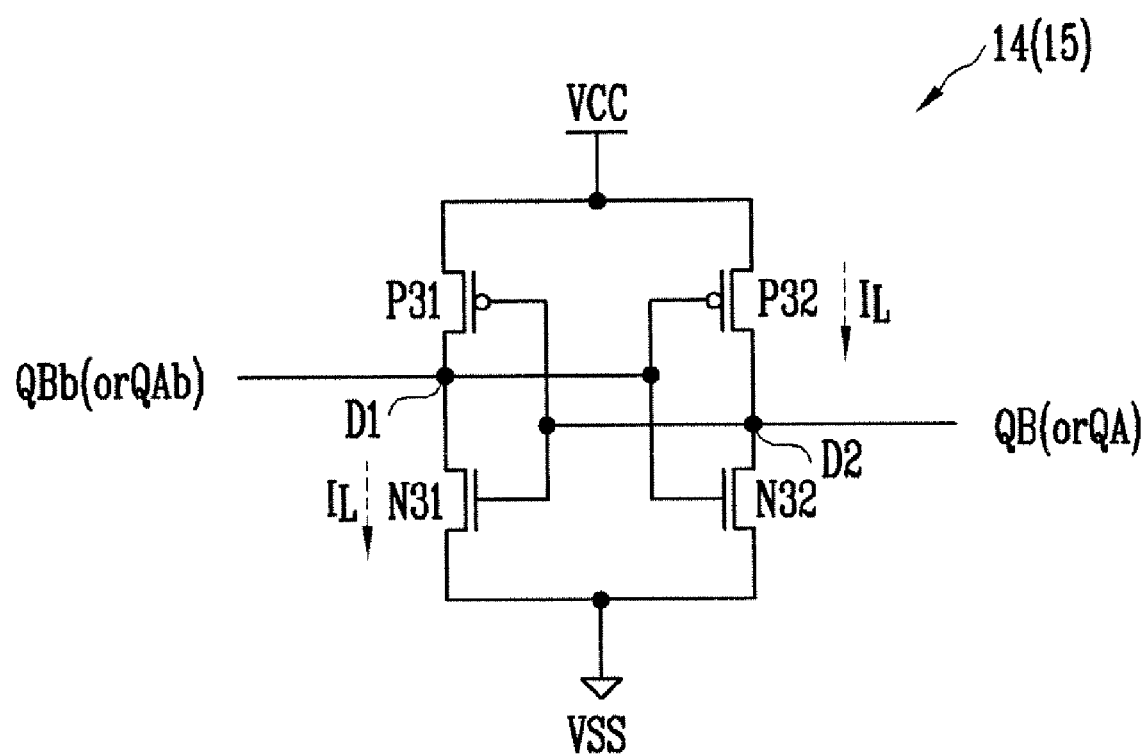
FIG. 2 is a diagram showing the main latch circuit (or cache latch circuit) of FIG. 1 in detail.
Figure 3:
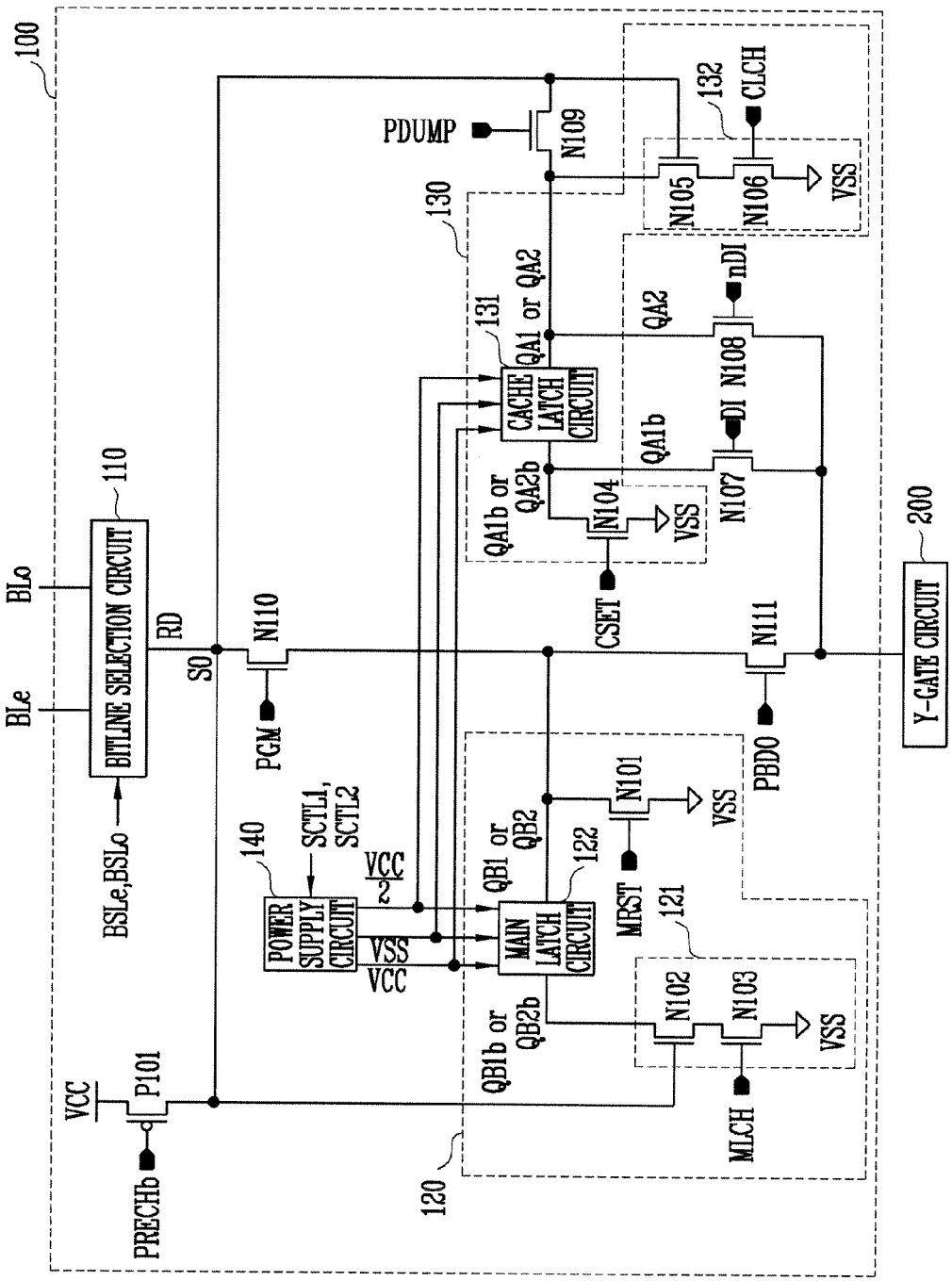
FIG. 3 is a diagram illustrating a page buffer circuit of a flash memory device.

FIG. 3 is a diagram illustrating a page buffer circuit of a flash memory device.

Referring to FIG. 3, the page buffer circuit 100 may include a bitline selection circuit 110, a main register circuit 120, a cache register circuit 130, a power supply circuit 140, a precharging circuit P101, and switches N107~N111. Here, the precharging circuit P101 may be implemented by a PMOS transistor, and the switches N107~N111 may be constructed of NMOS transistors. Hereinafter, the precharging circuit P101 will be referred to as the PMOS transistor and the switches N107~N111 will be referred to as NMOS transistors. The bitline selection circuit 110 connects one of bitlines BLe and BLo to a sensing node SO in response to a bitline selection signal BSLe and BSLo. The main register circuit 120 may include a sensing circuit 121, a main latch circuit 122, and a main latch reset circuit N101. The sensing circuit 121 includes NMOS transistors N102 and N103. The sensing circuit 121 generates a first state data signal QB1b in response to a main latch signal MLCH and a read data signal RD received through the sensing node SO, or generates a second state data signal QB2b in response to the main latch signal MLCH and a program data signal QA1 or QA2 received through the sensing node SO.

The main latch circuit 122 holds the first state data signal QB1b or the second state data signal QB2b which is received from the sensing circuit 121, and outputs an inverse data signal QB1 of the first state data signal QB1b or an inverse data signal QB2 of the second state data signal QB2b. The main latch reset circuit N101 initializes the main latch circuit 122 in response to a main latch reset signal MRST.

The cache register circuit 130 may include a cache latch circuit 131 and a cache latch reset circuit N104. The cache latch circuit 131 holds the program data signal QA1b received through the NMOS transistor N107 when the NMOS transistor N107 is turned on, or holds the program data signal QA2 received through the NMOS transistor N108 when the NMOS transistor N108 is turned on. The cache latch circuit 131 holds the program data signal QA1b and outputs the inverse data signal QA1, or holds the program data signal QA2 and outputs the inverse data signal QA2b. The cache latch reset circuit N104 initializes the cache latch circuit 131 in response to a cache latch reset signal CSET. The cache register circuit 130 may further include a cache read control circuit 132. The cache read control circuit 132 does not operate in the normal mode of the page buffer 100. During the read operation with using the cache latch circuit 131, the cache read control circuit 132 operates in response to a cache latch signal CLCH.

The PMOS transistor P101 precharges the sensing node SO to the voltage VCC in response to a precharge control signal PRECHb. The NMOS transistor N109 is turned on or off in response to a control signal PDUMP. The NMOS transistor N109 may be turned on during the programming operation. The NMOS transistor N109 turned on to the inverse data signal QA1 or the program data signal QA2 from the cache latch circuit 131 to the main register circuit 120 through the sensing node SO, or turned off to disconnect the cache latch circuit 131 from the sensing node SO.

The NMOS transistor N110 outputs the inverse data signal QB2, which is received from the main latch circuit 122, to one of the bitlines BLe and BLo connected to the sensing node SO through bitline selection circuit 110 in the programming mode. The NMOS transistor N111 outputs the inverse data signal QB1 from the main latch circuit 122 to the Y-gate circuit 200 in response to a third control signal PBDO during the reading mode.

The power supply circuit 140 provides the voltages VCC and VSS for the main register circuit 122 and the cache register circuit 131 as operation voltages in response to the selection control signals SCTL1 and SCTL2 in the active mode. The power supply circuit 140 also provides a voltage VCC/2 for the main register circuit 122 and the cache register circuit 131 as operation voltages in response to the selection control signals SCTL1 and SCTL2 in the standby mode.

Figure 4:
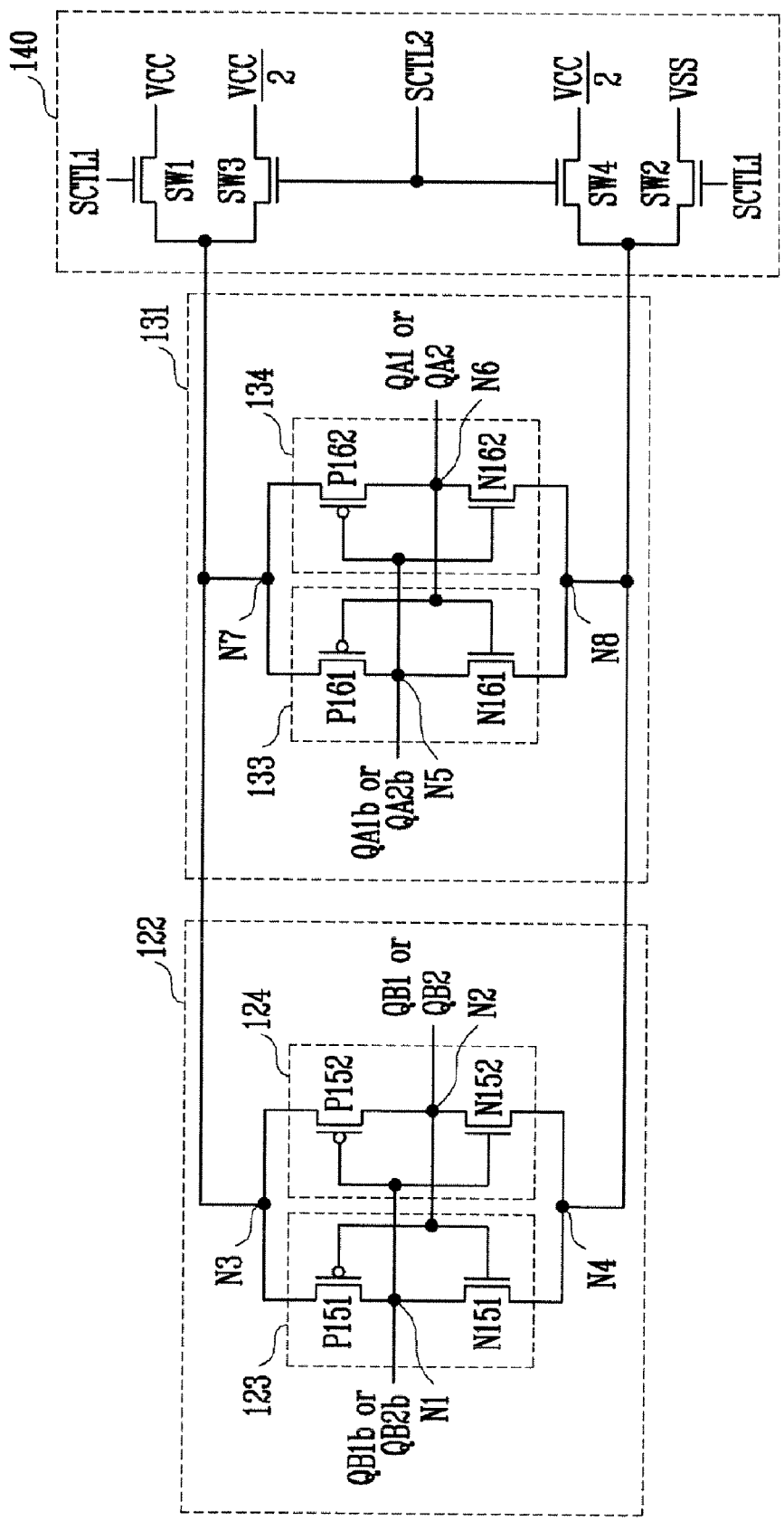
FIG. 4 is a diagram illustrating a main latch circuit, a cache latch circuit, and a power supply circuit shown in FIG. 3.

FIG. 4 is a diagram illustrating a main latch circuit, a cache latch circuit, and a power supply circuit shown in FIG. 3. it will be described about detailed constructions and operations in the main latch circuit 122, the cache latch circuit 131, and the power supply circuit 140.

Referring to FIG. 4, the main latch circuit 122 may include inverters 123 and 124. A node N1 is commonly connected to an output terminal of the inverter 123 and an input terminal of the inverter 124. A node N2 is commonly connected to an input terminal of the inverter 123 and an output terminal of the inverter 124. The inverter 124 outputs the inverse data signal QB1 of the first state data signal or the inverse data signal QB2 of the second state data signal to the node N2 in response to the first state data signal QB1$b$ or the second state data signal QB2$b$. The inverter 123 may be a PMOS transistor P151 and an NMOS transistor N151. The inverter 124 may be a PMOS transistor P152 and an NMOS transistor N152. The operation voltages are supplied to the inverters 123 and 124 by way of nodes N3 and N4.

The cache latch circuit 131 may include inverters 133 and 134. A node N5 is commonly connected to an output terminal of the inverter 133 and an input terminal of the inverter 134. A node N6 is commonly connected to an input terminal of the inverter 133 and an output terminal of the inverter 134. The inverter 134 outputs the inverse data signal QA1 to the node N6 in response to the program data signal QA1$b$ input through the node N5. The inverter 133 outputs the inverse data signal QA2$b$ to the node N5 in response to the program data signal QA2 input through the node N6. The inverter 133 may be a PMOS transistor P161 and an NMOS transistor N161. The inverter 134 may be a PMOS transistor P162 and an NMOS transistor N162. The operation voltages are supplied to the inverters 133 and 134 by way of nodes N7 and N8.

The power supply circuit 140 may be switches SW1~SW4. The switch SW1 is connected among the nodes N3 and N7, and the voltage VCC, being turned on or off in response to the selection control signal SCTL1. The switch SW2 is connected among the nodes N4 and N8, and the voltage VSS, being turned on or off in response to the selection control signal SCTL1. The switch SW3 is connected among the nodes N3 and N7, and the voltage VCC/2, being turned on or off in response to the selection control signal SCTL2. The switch SW4 is connected among the nodes N4 and N8, and the voltage VCC/2, being turned on or off in response to the selection control signal SCTL2.

Next, it will be described about operations in the main latch circuit 122, the cache latch circuit 131, and the power supply circuit 140 during the active and standby modes.

First, in the active mode, the selection control signal SCTL1 is enabled while the selection control signal SCTL2 is disabled. After then, the switches SW1 and SW2 are turned on in response to the selection control signal SCTL1 while the switches SW3 and SW4 are turned off in response to the selection control signal SCTL2. As a result, the nodes N3 and N7 are supplied with the voltage VCC while the nodes N4 and N8 are supplied with the voltage VSS. In other words, the voltages VCC and VSS are supplied to the main latch circuit 122 and the cache latch circuit 131 as the operation voltages. During this, the nodes N1 and N2 are different from each other in voltage level, and the nodes N5 and N6 are also different from each other in voltage level. For instance, when the nodes N1 and N5 are set on the voltage VCC, the nodes N2 and N6 are established on the voltage VSS.

Next, in the standby mode, the selection control signal SCTL1 is disabled while the selection control signal SCTL2 is enabled. After then, the switches SW1 and SW2 are turned off in response to the selection control signal SCTL1 while the switches SW3 and SW4 are turned on in response to the selection control signal SCTL2. As a result, the nodes N3, N4, N7 and N8 are all supplied with the voltage VCC/2. In other words, the voltages VCC/2 are supplied to the main latch circuit 122 and the cache latch circuit 131 as the operation voltages. During this, the nodes N1, N2, N5 and N6 are maintained on the voltage level of VCC/2. For instance, in the main latch circuit 122, the nodes N1 and N2 are supplied with the voltage VCC/2 when the PMOS transistor 151 and the NMOS transistor N152 are turned on while the PMOS transistor 152 and the NMOS transistor N151 are turned off. As the voltage levels of the nodes N1 and N2 are the voltage level VCC/2, as same as those of the nodes N3 and N4, there is no leakage current through the PMOS transistor P152 and the NMOS transistor N151 those are turned on. Thus, the page buffer 100 is able to reduce consumption power by the leakage current in the standby mode.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

As stated above, it is possible to reduce consumption power in the page buffer circuit during the standby mode, for which the latch circuits are supplied with different power voltages from each other in the standby and normal modes.

What is claimed as new and desired to be protected by Letters Patent of the United States is:

1. A page buffer of a flash memory device, comprising
   a bitline selection circuit connecting one of at least two bitlines to a sensing node in response to bitline selection signals;
   a cache register circuit storing a program data signal during a programming operation;
   a main register circuit storing a first state data signal corresponding to a read data signal received from one of the two bitlines through the sensing node in a reading operation, in response to a main latch signal, or storing a second state data signal corresponding to the program data signal received from the cache register circuit through the sensing node in a programming operation; and
   a power supply circuit providing first and second voltages to the main register circuit and the cache register circuit as operation voltages in an active mode, and providing a third voltage to the main register circuit and the cache register circuit as operation voltages in a standby mode.

2. The page buffer of a flash memory device as set forth in claim 1, which further comprises:
   a precharge circuit charging the sensing node up to a predetermined voltage level in response to a precharge control signal;
   a first switch transferring the program data signal from the cache register circuit to the main register circuit through the sensing node in the programming operation, in response to a first control signal, and disconnecting the cache register circuit from the sensing node in the reading operation;

a second switch transferring an inverse data signal of the second state data signal from the main register circuit to one of the two bitlines connected to the sensing node through the bitline selection circuit in a second control signal during the programming operation; and a third switch transferring an inverse data signal of the first state data signal from the main register circuit to a Y-gate circuit in response to a third control signal during the reading operation.

3. The page buffer of a flash memory device as set forth in claim 1, wherein the third voltage is lower than the first voltage and higher than the second voltage.

4. The page buffer of a flash memory device as set forth in claim 1, wherein the main register circuit comprises:

a sensing circuit generating the first state data signal in response to the main latch signal and the read data signal, or generating the second state data signal in response to the main latch signal and the program data signal;

a main latch circuit, connected to the sensing circuit through a first node, holding the first or second state data signal received through the first node and transferring an inverse data signal of the first state data signal or an inverse data signal of the second state data signal to a second node; and a main latch rest circuit initializing the main latch circuit in response to a main latch reset signal, wherein the first and second nodes have different voltage levels from each other in the active mode, while the first and second nodes have the same voltage level in the standby mode.

5. The page buffer of a flash memory device as set forth in claim 4, wherein the cache register circuit comprises:

a cache latch circuit, connected between a third node and a fourth node, holding the program data signal received through the third node and transferring an inverse data signal of the program data signal to the fourth node, or holding the program data signal and transferring the inversed data signal of the program data signal to the third node; and a cache latch rest circuit, connected to the cache latch circuit through the third node, initializing the cache latch circuit in response to a cache latch reset signal, wherein the third and fourth nodes have different voltage levels from each other in the active mode, while the third and fourth nodes have the same voltage level in the standby mode.

6. The page buffer of a flash memory device as set forth in claim 5, wherein the main latch circuit comprises:

a first inverter having an output terminal connected to the first node and an input terminal connected to the second node, receiving the operation voltages through fifth and sixth nodes; and a second inverter having an input terminal connected to the first node and an output terminal connected to the second node, receiving the operation voltages through the fifth and sixth nodes, wherein the cache latch circuit comprise:

a third inverter having an output terminal connected to the third node and an input terminal connected to the fourth node, receiving the operation voltages through seventh and eighth nodes; and a fourth inverter having an input terminal connected to the third node and an output terminal connected to the fourth node, receiving the operation voltages through the seventh and eighth nodes.

7. The page buffer of a flash memory device as set forth in claim 6, wherein the power supply circuit comprises:

a first switch connected among the fifth node, the seventh node, and the first voltage, and being turned on or off in response to a first selection control signal;

a second switch connected among the sixth node, the eighth node, and the second voltage, and being turned on or off in response to the first selection control signal;

a third switch connected among the fifth node, the seventh node, and the third voltage, and being turned on or off in response to a second selection control signal; and a fourth switch connected among the sixth node, the eighth node, and the third voltage, and being turned on or off in response to the second selection control signal.

8. The page buffer of a flash memory device as set forth in claim 7, wherein in the active mode, the first selection control signal is enabled while the second selection is disabled, and in the standby mode, the first selection control signal is disabled while the second selection is enabled, wherein the first and second switches are turned on when the first selection control signal is enabled, while the third and fourth switches are turned on when the second selection control signal is enabled.

* * * * *

UNITED STATES PATENT AND TRADEMARK OFFICE
CERTIFICATE OF CORRECTION

| | | |
|---|---|---|
| PATENT NO. | : 7,149,130 B2 | Page 1 of 1 |
| APPLICATION NO. | : 11/164678 | |
| DATED | : December 12, 2006 | |
| INVENTOR(S) | : Yun B. Lee | |

It is certified that error appears in the above-identified patent and that said Letters Patent is hereby corrected as shown below:

At Column 8, line 11, "comprise" should be -- comprises --.

Signed and Sealed this

First Day of May, 2007

JON W. DUDAS
*Director of the United States Patent and Trademark Office*